United States Patent
Kreuter et al.

(10) Patent No.: US 10,763,238 B2
(45) Date of Patent: Sep. 1, 2020

(54) METHOD OF ALIGNING SEMICONDUCTOR CHIPS, METHOD OF ARRANGING SEMICONDUCTOR CHIPS, DEVICE THAT PRODUCES A SEMICONDUCTOR COMPONENT, AND SEMICONDUCTOR COMPONENT

(71) Applicant: OSRAM Opto Semiconductors GmbH, Regensburg (DE)

(72) Inventors: Philipp Kreuter, Regensburg (DE); Andreas Biebersdorf, Regensburg (DE); Christoph Klemp, Regensburg (DE); Jens Ebbecke, Rohr in Niederbayern (DE); Ines Pietzonka, Donaustauf (DE); Petrus Sundgren, Lappersdorf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/329,449

(22) PCT Filed: Aug. 30, 2017

(86) PCT No.: PCT/EP2017/071797
§ 371 (c)(1),
(2) Date: Feb. 28, 2019

(87) PCT Pub. No.: WO2018/041909
PCT Pub. Date: Mar. 8, 2018

(65) Prior Publication Data
US 2019/0214364 A1    Jul. 11, 2019

(30) Foreign Application Priority Data

Sep. 1, 2016 (DE) .................. 10 2016 116 353

(51) Int. Cl.
*H01L 23/00* (2006.01)
*H01L 33/00* (2010.01)
*H01L 25/075* (2006.01)

(52) U.S. Cl.
CPC .............. *H01L 24/96* (2013.01); *H01L 24/83* (2013.01); *H01L 24/95* (2013.01);
(Continued)

(58) Field of Classification Search
None
See application file for complete search history.

(56) References Cited

U.S. PATENT DOCUMENTS

| 5,355,577 A | 10/1994 | Cohn |
|---|---|---|
| 2004/0248416 A1 | 12/2004 | Bock |

(Continued)

FOREIGN PATENT DOCUMENTS

| DE | 10 2007 021 009 | 4/2008 |
|---|---|---|
| DE | 10 2007 021 099 | 11/2008 |

(Continued)

OTHER PUBLICATIONS

"Printing the Impossible," *NthDegree Technologies Worldwide Inc.*, printout downloaded Jul. 7, 2016 of www.ndeg.com, pp. 1-2.

*Primary Examiner* — Angel Roman
(74) *Attorney, Agent, or Firm* — DLA Piper LLP (US)

(57) ABSTRACT

A method of aligning semiconductor chips in a medium includes providing an electrically insulating liquid medium; providing semiconductor chips; forming a suspension with the medium and the semiconductor chips; exposing the semiconductor chips to electromagnetic radiation that generates free charge carriers in the semiconductor chips; arranging the suspension in an electric field in which the semiconductor chips are aligned along the electric field; and curing the medium after aligning the semiconductor chips.

19 Claims, 4 Drawing Sheets

(52) U.S. Cl.
CPC ...... *H01L 25/0753* (2013.01); *H01L 33/0095* (2013.01); *H01L 2224/95085* (2013.01); *H01L 2224/95145* (2013.01); *H01L 2924/12041* (2013.01)

(56) References Cited

U.S. PATENT DOCUMENTS

| | | |
|---|---|---|
| 2005/0009303 A1 | 1/2005 | Schatz |
| 2006/0057293 A1 | 3/2006 | Sharma et al. |
| 2006/0128057 A1* | 6/2006 | Lu .................... H01L 21/67271 438/106 |
| 2008/0023435 A1 | 1/2008 | Wu et al. |
| 2009/0218260 A1* | 9/2009 | Chow ................... B81C 99/002 209/577 |
| 2013/0168708 A1* | 7/2013 | Shibata ............... H01L 25/0753 257/88 |
| 2014/0261613 A1* | 9/2014 | Nielson ............... H01L 31/1876 136/244 |
| 2015/0223346 A1 | 8/2015 | Serre et al. |

FOREIGN PATENT DOCUMENTS

| | | |
|---|---|---|
| DE | 10 2007 024 074 | 11/2008 |
| DE | 10 2011 005 940 | 9/2012 |
| EP | 2 688 093 | 1/2014 |

\* cited by examiner

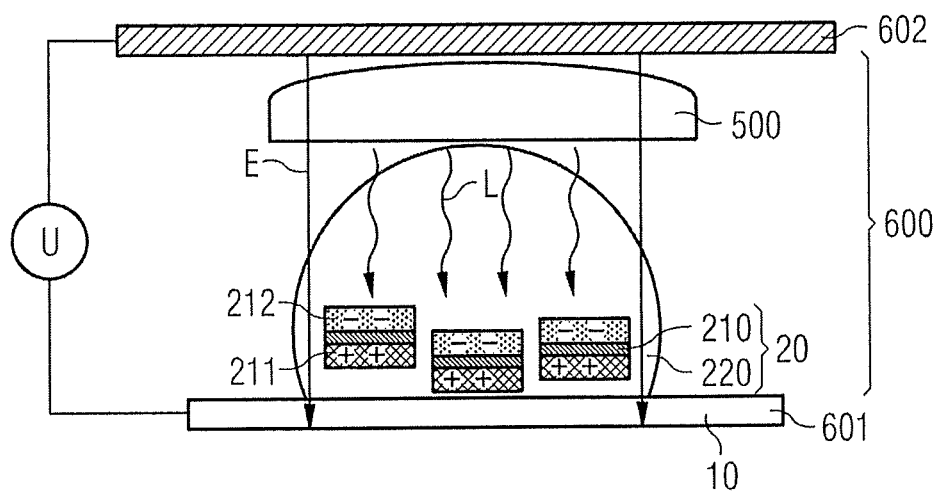
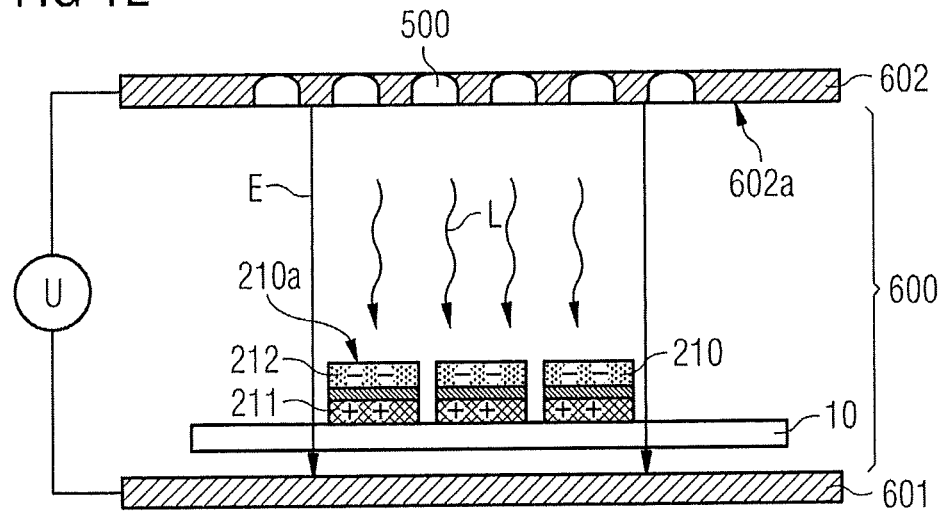

METHOD OF ALIGNING SEMICONDUCTOR CHIPS, METHOD OF ARRANGING SEMICONDUCTOR CHIPS, DEVICE THAT PRODUCES A SEMICONDUCTOR COMPONENT, AND SEMICONDUCTOR COMPONENT

TECHNICAL FIELD

This disclosure relates to a method of aligning semiconductor chips, a method of arranging semiconductor chips, a device that produces a semiconductor component and a semiconductor component.

BACKGROUND

Among other things, a problem in the art is to provide a method of aligning semiconductor chips in a medium in which the semiconductor chips are aligned in a particularly reliable, time-efficient and cost-efficient manner so that they have the same orientation. Another problem in the art is to provide a method of arranging semiconductor chips on a carrier, wherein the semiconductor chips are arranged on the carrier in a particularly time-efficient and cost-efficient manner and are reliably aligned relative to the carrier. Still another problem in the art, inter alia, is to provide a device that produces a semiconductor component, with which a method of aligning semiconductor chips and a method of arranging semiconductor chips on a carrier can be performed. Yet another problem in the art is, inter alia, to provide a semiconductor component produced by a printing process and has improved efficiency.

SUMMARY

We provide a method of aligning semiconductor chips in a medium including providing an electrically insulating liquid medium; providing semiconductor chips; forming a suspension with the medium and the semiconductor chips; exposing the semiconductor chips to electromagnetic radiation that generates free charge carriers in the semiconductor chips; arranging the suspension in an electric field in which the semiconductor chips are aligned along the electric field; and curing the medium after aligning the semiconductor chips.

We also provide a method of arranging semiconductor chips on a carrier including performing the method of aligning semiconductor chips in a medium including providing an electrically insulating liquid medium; providing semiconductor chips; forming a suspension with the medium and the semiconductor chips; exposing the semiconductor chips to electromagnetic radiation that generates free charge carriers in the semiconductor chips; arranging the suspension in an electric field in which the semiconductor chips are aligned along the electric field; and curing the medium after aligning the semiconductor chips, wherein the suspension is arranged on the carrier.

We further provide a device that produces a semiconductor component having a light source, a first electrode, and a second electrode, including means for adapting the light source to illuminate a region between the first and the second electrode with electromagnetic radiation, means for adapting the first and the second electrode to generate in the region an electric field, means for providing a suspension comprising a medium and semiconductor chips that arranges an electric field between the electrodes, and means for arranging a light source such that the second electrode has a surface with at least one cut-out, or the second electrode has a surface on which a light guide is arranged.

We still further provide a semiconductor component including a carrier and a plurality of semiconductor chips, wherein the semiconductor chips each have a n-conducting region and a p-conducting region, at least 70% of the semiconductor chips have the same orientation and are in direct contact with the carrier, the semiconductor chips have a maximum edge length of 10 µm, the semiconductor chips are arranged on the carrier by printing, and the semiconductor chips are surrounded in the lateral plane by a cured medium.

BRIEF DESCRIPTION OF THE DRAWINGS

FIGS. 1A, 1B, 1C, 1D, and 1E show method steps of the method of aligning semiconductor chips in a medium and method steps of the method of arranging semiconductor chips on a carrier.

Figure 1A:
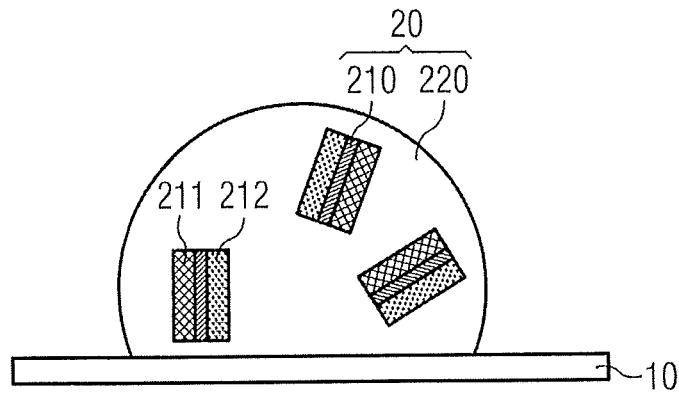

LIST OF REFERENCE NUMBERS 1 semiconductor component
10 carrier
20 suspension
210 semiconductor chip
210a side of the semiconductor chips facing away from the carrier
211 p-conducting region
212 n-conducting region
220 medium
30 roll
500 light source
501 light guide
600 region between first and second electrode
601 first electrode
602 second electrode
70 electrical contact
71 insulating layer
E electric field
L electromagnetic radiation
EL energy of electromagnetic radiation
EB energy of the bandgap of semiconductor chips
U voltage source

DETAILED DESCRIPTION

Our method of aligning semiconductor chips in a medium, first provides an electrically insulating liquid medium. For example, the medium comprises or is a dielectric ink, a dielectric solvent or a plastic dielectric material. In particular, the ink has a high resistivity, for example, the resistivity is at least $10^{10}$ Ωm. For example, the medium has a low viscosity. In particular, the viscosity of the medium is less than 10 mPas. The medium may be transparent in a wavelength range that is, for example, between infrared and UV radiation. Advantageously, the medium has properties controlled with respect to the method of aligning semiconductor chips in the medium. For example, the medium is characterized by high transparency, low electrical conductivity, low viscosity, and density lower than the density of semiconductor chips to be aligned.

In the method, semiconductor chips are provided. The semiconductor chips each have a p-conducting region and an n-conducting region. The p-conducting region and the n-conducting region can directly adjoin one another such that a depletion zone arises in the region in which the p-conducting and the n-conducting region adjoin one another. For example, the semiconductor chips are diodes. In particular, the semiconductor chips are light-emitting diodes configured to generate electromagnetic radiation during normal operation. For example, the semiconductor chips are configured to generate light in the spectral range from UV radiation to infrared radiation, in particular visible light.

In our method of aligning semiconductor chips in a medium, a suspension is formed with the medium and the semiconductor chips. For example, the suspension is such that the semiconductor chips are finely distributed in the medium. In particular, the volume of the medium is sufficiently large that the semiconductor chips can float in the medium. In particular, the semiconductor chips have a higher density than the medium so that the semiconductor chips sink in the medium. Between adjacent semiconductor chips in the suspension, the medium is preferably arranged. At least a majority of the semiconductor chips, in particular at least 90% of the semiconductor chips or at least 99% of the semiconductor chips are completely surrounded by the medium.

The semiconductor chips may be exposed to electromagnetic radiation in one method step to produce free charge carriers. When the semiconductor chips are exposed to electromagnetic radiation, the photoelectric effect, in particular the photovoltaic effect, occurs in the semiconductor chips. The electromagnetic radiation is absorbed in the region in which the n-conducting region and the p-conducting region of the semiconductor chips adjoin one another, and generates free charge carriers, in particular free charge carrier pairs, in the semiconductor chips. The charge carrier pairs that form in the semiconductor chips are separated and move into the p-conducting or the n-conducting region. In this example, negative charge carriers move into the n-conducting region and positive charge carriers move into the p-conducting region of the semiconductor chips. Since the semiconductor chips are arranged in an electrically insulating medium, the charge carriers do not flow off via the medium. Advantageously, an excess of positive charge carriers arises in the p-conducting region and an excess of negative charge carriers in the n-conducting region.

The suspension may be arranged in an electric field. In this example, the semiconductor chips are aligned along the electric field. The semiconductor chips have more positive than negative charge carriers in the p-conducting region and more negative than positive charge carriers in the n-conducting region. The Coulomb force acts on the charge carriers in the electric field. The direction of Coulomb force acting on negative charge carriers is opposite to the direction of Coulomb force acting on positive charge carriers. The Coulomb force acting on the spatially separated positive and negative charge carriers results in a force by which the semiconductor chips are respectively aligned along the electric field. In this example, the semiconductor chips are aligned such that the n-conducting region faces the electrode with the more negative potential and the p-conducting region faces the electrode with the more positive potential. Advantageously, the orientation of the semiconductor chips can be controlled by the polarity of the first and second electrodes.

Semiconductor chips not aligned along the field prior to the application of the electric field can move in the medium, in particular rotate so that their alignment is at least approximately along field lines of the field. The aligned position is under the influence of the Coulomb forces the energetically most favorable state for the semiconductor chips. The semiconductor chips are aligned by the Coulomb forces and held in the aligned position. In the aligned position, the p-conducting region faces the lower potential electrode and the n-conducting region faces the higher potential electrode. In particular, the first electrode is arranged on the side of the carrier facing away from the suspension, or the carrier acts as the first electrode. And the second electrode is arranged in particular on the side facing away from the carrier of the suspension. In the aligned position, the n-conducting region is then turned away from the carrier and the p-conducting region faces the carrier. Alternatively, in the aligned position, the p-conducting region faces away from the carrier and the n-conducting region faces the carrier. In the aligned position, the surfaces of the semiconductor chips facing the carrier run parallel to the surface of the carrier facing the semiconductor chips, or the surfaces of the semiconductor chips facing the carrier are inclined at most by 45° to the surface of the carrier facing the semiconductor chips. Advantageously, after alignment, at least 80%, in particular at least 90%, of the semiconductor chips are in the aligned position.

An electrically insulating, liquid medium may initially be provided. Furthermore, semiconductor chips may be provided. In a further method step, a suspension with the medium and the semiconductor chips may be formed. In a next method step, the semiconductor chips may be exposed to electromagnetic radiation to generate free charge carriers in the semiconductor chips. In a further method step, the suspension may be arranged in an electric field, in which the semiconductor chips are aligned along the electric field.

When arranging semiconductor chips by a printing method, the semiconductor chips are first arranged in a liquid printing medium. The semiconductor chips are randomly aligned in the liquid. For electrical contacting, a first electrode is arranged on one side of the semiconductor chips and a second electrode is arranged on an opposite side of the semiconductor chips. Due to the random orientation of the semiconductor chips between the first and the second electrode, these can only be partially electrically contacted and operated.

The method makes use, inter alia, of the idea of exposing the semiconductor chips to electromagnetic radiation so that separation of charge carriers takes place in the semiconductor chips. Since the medium surrounding the semiconductor chips is electrically insulating, the charge carriers do not flow off via the medium. By arranging the semiconductor chips in an electric field, Coulomb forces act on the spatially separated charge carriers. By the Coulomb forces acting on the charge carriers, the semiconductor chips in the medium are aligned along the electric field.

Advantageously, such a method enables a large number of semiconductor chips to be aligned in a medium so that they have the same orientation. Advantageously, the semiconductor chips aligned in this way can be electrically contacted and operated in a particularly efficient manner.

The medium may be transparent for the electromagnetic radiation used to generate the free charge carriers. For example, the medium is transparent in the entire visible wavelength range. Alternatively, the medium can be transparent only to electromagnetic radiation of the wavelength range suitable for generating free charge carriers in the optoelectronic semiconductor chips. Advantageously, no or hardly any electromagnetic radiation suitable for generating free charge carriers in the semiconductor chips is absorbed by the medium surrounding the semiconductor chips. That is, the transmittance of the medium is preferably at least 90% for this radiation. Thus, a particularly large part of the electromagnetic radiation can generate free charge carriers in the semiconductor chips.

Exposing the semiconductor chips to electromagnetic radiation and arranging the suspension in an electric field may take place simultaneously. "Simultaneous" means, for example, that during a time in which the electric field acts on the semiconductor chips, the exposure of the semiconductor chips takes place at least temporarily, while they are arranged in the electric field.

For example, the semiconductor chips are arranged between a first and a second electrode by which the electric field is generated. Between one of the electrodes and the semiconductor chips, a light source can be arranged. Alternatively, one of the electrodes may have cut-outs through which electromagnetic radiation may enter the region between the first and second electrodes. In particular, light guides can be arranged in these cut-outs. Alternatively, light sources may be disposed in the electrode. Alternatively or additionally, light sources may be arranged adjacent to an electrode in a lateral plane perpendicular to the electric field. Advantageously, the charge carrier density of the excess positive charge carriers in the p-conducting region and the excess negative charge carriers in the n-conducting region is particularly high, while the semiconductor chips are arranged in the electric field. With a higher number of free charge carriers located in spatially separated areas, the Coulomb force by which the semiconductor chips are aligned increases.

The electric field may be formed between a first and a second electrode. The distance of the suspension to the first electrode may be smaller than the distance to the second electrode. For example, the distance of the suspension from the first electrode is at most 10%, in particular at most 100% of the distance to the second electrode. In particular, the distance between the suspension and the second electrode may be so great that the Coulomb forces between charge carriers of the second electrode and charge carriers in the semiconductor chips are negligible.

For example, a light source is arranged between the suspension and the second electrode, which is configured to generate electromagnetic radiation to expose the semiconductor chips. Advantageously, a large distance between the suspension and the second electrode allows the suspension to be freely accessible from the side facing away from the first electrode. For example, further process steps can be carried out from the side of the suspension facing away from the first electrode, while the suspension is arranged in the electric field. In particular, the light source that generates free charge carriers in the semiconductor chips is arranged on the side of the suspension facing away from the first electrode.

The semiconductor chips may comprise a region with an energy band gap. Furthermore, the electromagnetic radiation may have an energy greater than the energy of the band gap. In particular, the electromagnetic radiation is chosen such that the energy of the electromagnetic radiation is sufficient to generate free charge carrier pairs in the semiconductor chips. In addition, the electromagnetic radiation may be selected such that it is absorbed only to the smallest possible extent in the medium surrounding the semiconductor chips. Advantageously, such electromagnetic radiation makes it possible to generate free charge carriers in the semiconductor chips.

We also provide a method of arranging semiconductor chips on a carrier.

In the method of arranging semiconductor chips on a carrier, the semiconductor chips may be aligned with a method described here of aligning semiconductor chips in a medium. That is, all the features described for the method of aligning semiconductor chips are also disclosed for the method of arranging semiconductor chips on a carrier and vice versa.

The suspension is placed on the carrier. For example, the suspension is placed on a carrier before being exposed and before being placed in an electric field. The carrier may be formed, for example, with an electrically insulating material. Alternatively or additionally, the carrier may be formed with an electrically conductive material or comprise electrically conductive structures. In particular, the electrically conductive structures are designed to contact and operate the semiconductor chips in an electrically conductive manner. For example, the carrier may be a connection carrier, for example, a circuit board. The carrier may also comprise portions of at least one of the following materials: paper, cardboard, plastic, textile materials.

The suspension may be arranged on the carrier by a printing method. For example, the suspension is arranged on the carrier by an inkjet printing process, a screen printing process or by a gravure printing process. Advantageously, with such a method, a large number of semiconductor chips can be arranged planar on a substrate, wherein the planar arrangement can have any desired geometry. For example, the planar arrangement of the semiconductor chips may have the shape of polygonal or round geometric shapes. In particular, the planar arrangement may have the contour of characters or numbers. Advantageously, a large number of semiconductor chips can be arranged on the carrier particularly quickly and efficiently by a printing method.

A first electrode may be in direct contact with the carrier. The carrier may be, for example, electrically insulating. For example, the first electrode may have a surface extending parallel to the side of the carrier facing the electrode. Alternatively, the carrier may be electrically conductive. For example, the electrode may be a sliding contact electrically conductively connected to the carrier so that the electric field is formed between the carrier and the second electrode. Advantageously, the first electrode is arranged particularly close to the semiconductor chips so that a particularly strong electric field arises, in which the semiconductor chips are aligned.

The medium may be cured after alignment of the semiconductor chips. The medium is cured, for example, by electromagnetic radiation, in particular UV radiation, or heating the medium to an elevated temperature. During curing of the medium, a part of the medium can evaporate, in particular a large part of the medium can evaporate. Furthermore, the medium can be configured to act as a connection material between the carrier and the semiconductor chips so that the semiconductor chips are fixedly arranged on the carrier.

In particular, the medium is cured when the semiconductor chips have settled in the medium. For example, the semiconductor chips are in direct mechanical contact with the carrier. After the medium has been cured, the side surfaces of the semiconductor chips connecting the side of the semiconductor chips facing away from the carrier to the side of the semiconductor chips facing the carrier are at least partially covered by the medium. The surfaces of the semiconductor chips facing the carrier are in direct contact with the carrier and can be contacted and operated via this in an electrically conductive manner. Advantageously, the medium has several functions. In the liquid state, the medium is able to arrange the semiconductor chips on a carrier by a printing process. Once the medium is cured, the medium serves as electrical insulation and passivation of the side surfaces of the semiconductor chips and can additionally serve as a mechanical connection material between the semiconductor chips and the carrier.

After curing the medium, a side of the semiconductor chips facing away from the carrier may be free of the medium or exposed in places. The volume of the medium can be reduced, for example, during curing. In particular, the volume can be reduced such that the sides of the semiconductor chips facing away from the carrier are not covered by the medium after curing. Alternatively, the medium can be removed after curing so that the surfaces of the semiconductor chips facing away from the carrier are free of the medium. For example, the medium can be removed at least in places by a polishing process or laser radiation. In particular, the surfaces of the semiconductor chips facing away from the carrier are flush with the surface of the medium facing away from the carrier. Advantageously, the semiconductor chips can be electrically conductively contacted and operated via the exposed surfaces.

After the alignment of the semiconductor chips, the medium may be completely removed. For example, the medium exclusively comprises materials that can be removed by evaporation without leaving residues on the carrier or the semiconductor chips. In particular, the medium can be removed by increasing the temperature of the carrier and the semiconductor chips. Advantageously, the side surfaces connecting the side facing the carrier and the side facing away from the carrier of the semiconductor chips, are freely accessible. For example, the semiconductor chips can be processed in a further method step or covered with an insulating layer. The insulating layer may have, for example, reflective, scattering or converting properties for the electromagnetic radiation generated in the semiconductor chips.

After curing or removal of the medium, at least 70% of the semiconductor chips may be in direct contact with the carrier. In particular, at least 80% of the semiconductor chips, preferably more than 90% of the semiconductor chips, are in direct contact with the carrier. Advantageously, a majority of the semiconductor chips, in particular more than 80% of the semiconductor chips, are in direct contact with the carrier with the side of the n-conducting region facing away from the p-conducting region. Alternatively, a majority of the semiconductor chips, in particular more than 80% of the semiconductor chips, are in direct contact with the carrier with the side of the p-conducting region facing away from the n-conducting region. The semiconductor chips can be electrically conductively contacted and operated, for example, via the carrier.

The carrier may be adapted to be used in a roll-to-roll method. The carrier has, for example, flexible mechanical properties so that it can be rolled up on a roll. For example, in a method step, the carrier located on a roll is unrolled. In further method steps, the semiconductor chips in the suspension are arranged on the carrier by printing, the semiconductor chips are aligned in the medium, the medium is removed and/or cured. In addition, further method steps can be carried out, for example, to fasten the semiconductor chips on the carrier and electrically contact the semiconductor chips. Subsequently, the carrier is singulated and/or rolled up on a roll. Advantageously, with a carrier that can be rolled up, a large number of semiconductor chips can be arranged inexpensively and quickly on a carrier.

The carrier may be the first electrode by which the electric field is generated. For example, during the production process, the carrier is in direct contact with an electrode that electrically contacts the carrier. The carrier is then at an electrical potential different from the electrical potential of the second electrode. For example, during processing in a roll-to-roll process, the carrier is electrically conductively contacted by a sliding contact and acts as a first electrode. Advantageously, this arrangement allows the first electrode to have the smallest possible distance to the semiconductor chips. In particular, the electric field is particularly strong so that the semiconductor chips can be aligned particularly efficiently.

We also provide a device that produces a semiconductor component. By the device, in particular the method of aligning semiconductor chips in a medium and arranging semiconductor chips on a carrier can be carried out. That is, all the features disclosed for our methods are also disclosed for the device that produces a semiconductor component, and vice versa.

The device may comprise a light source that emits electromagnetic radiation during normal operation. For example, the light source emits electromagnetic radiation whose energy is greater than the energy of the band gap of semiconductor chips, which are exposed by the light source. In particular, the device comprises a plurality of light sources.

The device may comprise a first electrode and a second electrode. The first electrode and the second electrode may be spaced apart from each other and configured to generate an electric field during operation. In particular, the first and second electrodes may be arranged to generate an electric field with homogeneous field strength and direction. For example, the first and second electrodes are formed as a plate capacitor. Alternatively, only the second electrode may be in the form of a plate, and the first electrode may be a sliding contact. If the first electrode is in the form of a sliding contact, it is then in direct contact with a carrier. In particular, the carrier then acts as a first electrode.

The light source may illuminate a region between the first and the second electrode with electromagnetic radiation. In particular, the electromagnetic radiation emitted by the light source then passes through the region in which the first and second electrodes generate an electric field. The device may also include additional light sources such that the area between the first and second electrodes is illuminated from multiple directions. Advantageously, the device enables a simultaneous irradiation of the semiconductor chips with electromagnetic radiation and an arrangement of the semiconductor chips in the electric field.

The first and the second electrode may generate an electric field in the region by the first and the second electrode. For example, the first and second electrodes produce a particularly homogeneous electric field. In particular, the electric field has a particularly homogeneous direction. For example, the first and second electrodes form a plate capacitor. The electrodes are designed such that in the electric field between the electrodes, for example, a suspension comprising a medium and semiconductor chips can be arranged.

The second electrode may have a surface with at least one cut-out in which a light source is arranged in the cut-out. In particular, the surface with the cut-out may be the surface of the second electrode facing the first electrode. In this example, the cut-out can completely penetrate the second electrode transversely or perpendicular to its main extension direction. For example, the light source is a light-emitting diode or a light guide. In particular, the second electrode has a multiplicity of cut-outs on its surface facing the first electrode, where in each of the plurality of cut-outs one light source is arranged. Advantageously, such a device enables homogeneous illumination of semiconductor chips while they are arranged between the first and the second electrode. Furthermore, such a device allows a particularly small distance between the first and the second electrode, since no light source has to be arranged between the second electrode and the suspension. Advantageously, the particularly small distance between the first and the second electrode allows a particularly strong electric field.

The second electrode may have a surface on which a light guide is arranged. In particular, a light guide is arranged on the surface of the second electrode facing the first electrode. The light guide may, for example, cover the entire surface of the second electrode facing the first electrode. The light guide is designed such that electromagnetic radiation is coupled out in the direction of the first electrode from the light guide. By the decoupled light, the area between the first electrode and the second electrode can be exposed. For example, scattering particles are arranged in the light guide. Advantageously, the device allows a particularly homogeneous exposure of the region between the first and second electrodes and at the same time a particularly space-saving arrangement of the light source between the suspension and the second electrode. Furthermore, no cut-outs are needed in the second electrode, so that an electric field with a particularly homogeneous direction can be generated.

In particular, the device that produces a semiconductor component may comprise a device by which a suspension can be arranged between the electrodes. For example, this is a dispensing system by which liquids, in particular dispensations, can be handled. For example, the device by which a suspension can be arranged between the electrodes is a printing device.

We further provide a semiconductor component. The semiconductor component can in particular be produced by the device that produces a semiconductor component and methods described herein. That is, all features disclosed for the methods and the device that produces a semiconductor component are also disclosed for the semiconductor component and vice versa.

The semiconductor component may comprise a carrier and a plurality of semiconductor chips having an n-conducting and a p-conducting region. The carrier is, for example, a carrier suitable for a roll-to-roll process. In particular, the semiconductor chips can be electrically conductively contacted and operated by the carrier. The p-conducting and n-conducting regions are directly adjacent to each other. For example, the semiconductor chips are optoelectronic semiconductor chips, for example, diodes in particular light emitting diodes. The semiconductor chips may be configured to generate and emit electromagnetic radiation during normal operation.

At least 70% of the semiconductor chips may have a same orientation and are in direct contact with the carrier. In particular, at least 80% of the semiconductor chips, preferably more than 90% of the semiconductor chips, are in direct contact with the carrier and have a same orientation. For semiconductor chips having a same orientation, the p-conducting region is oriented identical relative to the n-conducting region. For example, the semiconductor chips are oriented such that the p-conducting region is arranged on the side of the semiconductor chip facing the carrier, and the n-conducting region is arranged on the side of the carrier facing away from the carrier. Alternatively, the semiconductor chips can also be oriented such that the n-conducting side faces the carrier and the p-conducting side faces away from the carrier. Semiconductor chips in direct contact with the carrier can be electrically conductively contacted and operated by the carrier. In particular, only the semiconductor chips are operated in normal operation, which have the same orientation as a majority of the other semiconductor chips and are in direct contact with the carrier.

The semiconductor chips may be surrounded by an electrically insulating medium in the lateral plane, parallel to the main extension plane of the carrier. In particular, the electrically insulating medium terminates flush with the sides of the semiconductor chips facing away from the carrier. Advantageously, the electrically insulating medium makes it possible to electrically conduct the semiconductor chips on their side facing away from the carrier by a planar electrical contacting.

The semiconductor chips may have a maximum edge length of 10 μm. The semiconductor chips preferably have a maximum edge length of 5 μm. Advantageously, the semiconductor chips are sufficiently small that they can be arranged on the carrier by a printing process.

The semiconductor chips may be arranged on the carrier by a printing process. For example, the semiconductor chips arranged on the carrier by a printing process and the carrier have residues of a medium on their surfaces and on the surface facing the semiconductor chips, which is suitable for applying the semiconductor chips to the carrier in a printing process. In particular, this medium can be cured so that the medium serves as a connecting material between the semiconductor chips and the carrier.

Furthermore, the semiconductor chips, which have the same orientation, can be arranged and rotated relative to one another. If the semiconductor chips are arranged and rotated relative to one another, then the semiconductor chips are arranged and rotated about an axis of symmetry running perpendicular to the surface of the semiconductor chips facing away from the carrier. Furthermore, the semiconductor chips applied by a printing process are characterized in that the number of semiconductor chips per unit area of the carrier varies. For example, the semiconductor chips are arranged at irregular distances from each other on the carrier. The semiconductor chips applied by printing are not present individually on the carrier, but instead are groups comprising, for example, at least 10, in particular at least 100 semiconductor chips. In addition, the semiconductor component may comprise semiconductor chips oriented such that they do not emit electromagnetic radiation during normal operation of the semiconductor component. Advantageously, a semiconductor component in which the semiconductor chips are arranged by printing on the carrier can be produced particularly efficiently and quickly. In particular, a semiconductor component, in which the semiconductor chips are arranged on a carrier by our method of arranging semiconductor chips, has a particularly large number of semiconductor chips by which electromagnetic radiation is emitted during normal operation.

The semiconductor chips may be electrically conductively contacted and operated via the carrier and an electrical contacting. Each electrical contact may be arranged on the side facing away from the carrier of the semiconductor chips. For example, the side surfaces connecting the surface facing away from the carrier and the surface of the semiconductor chips facing the carrier are covered by an electrically insulating material. The semiconductor chips are on their side facing the carrier in direct contact with the carrier and electrically conductively connect to it. For example, the electrically insulating material arranged in the lateral plane between the semiconductor chips, serves as a connecting material to mechanically connect the semiconductor chips to the carrier. The carrier may be formed with an electrically conductive material or comprise electrically conductive structures so that the semiconductor chip can be supplied with current and operated via the carrier. The side facing away from the carrier of the semiconductor chips is in direct contact with the electrical contacting. The semiconductor chips can be supplied with current and operated via the carrier and the electrical contacting. Advantageously, such an electrical contacting can be applied over a large area to the semiconductor chips so that a large number of semiconductor chips can be electrically conductively contacted simultaneously. The electrical contacting can be formed, for example, with an electrically conductive material, in particular with a transparent electrically conductive material, for example, indium tin oxide (ITO).

Advantageously, a planar electrical contacting of the semiconductor chips on their side of the semiconductor chips facing away from the carrier enables a particularly simple and reliable electrical contacting of the semiconductor chips.

Advantage and developments of our method of aligning semiconductor chips, our method of arranging semiconductor chips, our device that produces a semiconductor component, and our semiconductor component will become apparent from examples described below in association with the figures.

In the examples and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

FIG. 1A shows a schematic sectional view of a suspension 20 arranged on a carrier 10. The suspension 20 comprises a plurality of semiconductor chips 210 in a medium 220. The medium is liquid and electrically insulating. For example, the medium is transparent to electromagnetic radiation in the visible wavelength range and has a low viscosity. Each of the semiconductor chips 210 has a p-conducting region 211 and an n-conducting region 212 directly adjacent to each other. The semiconductor chips do not have the same orientation, but are randomly arranged and oriented within the medium. For example, the density of the semiconductor chips and the medium 220 differs only slightly. In particular, the density of the medium 220 and the semiconductor chips 210 differs by a maximum of 5% from each other. In particular, the density of the medium 220 is greater than the density of the semiconductor chips 210. Thus, after a given time, the semiconductor chips sink in the medium and are in direct mechanical contact with the carrier 10.

Figure 1B:
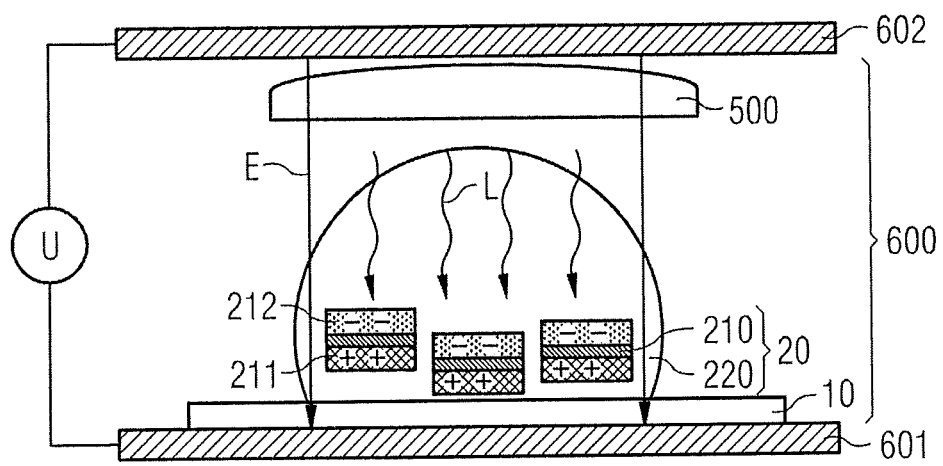

FIG. 1B shows a schematic sectional view of the device that produces a semiconductor component 1 and the method of aligning semiconductor chips 210 in a medium 220 and the method of arranging semiconductor chips 210 on a carrier 10. In this method step, the carrier 10 and the suspension 20 are arranged in a region 600 between a first electrode 601 and a second electrode 602 of the device. The first electrode 601 and the second electrode 602 connect to a voltage source U so that an electric field E is generated between the first electrode 601 and the second electrode 602.

In addition, between the first 601 and second 602 electrodes, the device comprises a light source 500 that emits electromagnetic radiation L having an energy EL. The light source is arranged on the side of the suspension 20 facing away from the carrier 10 so that the electromagnetic radiation L with the energy EL is at least partially absorbed in a region of the semiconductor chips 210 in which the p-conducting region 211 and the n-conducting region 212 are adjacent to each other. In this region, the semiconductor chips have a bandgap energy EB equal to or less than the energy EL of the electromagnetic radiation.

The electromagnetic radiation L emitted by the light source 500 passes through the medium 220 and is absorbed in the semiconductor chips 210. In this example, due to the photoelectric effect, free charge carriers are generated, where positive charge carriers migrating into the p-conducting region 211 and negative charge carriers moving into the n-conducting region 212 of the semiconductor chip 210. Due to the electric field E, Coulomb forces act on the carriers in the p-conducting region 211 and in the n-conducting region 212. Thus, the semiconductor chips 210 are aligned along the electric field E so that the p-conducting region 211 is aligned in the direction of first electrode 601 and the n-conducting region 212 is aligned in the direction of the second electrode 602. The first electrode is on a more positive potential than the second electrode 602.

In particular, the first electrode 601 may be in direct contact with the carrier 10 so that the carrier 10 is on the same potential as the first electrode 601 and thus also functions as an electrode. In this illustration, the semiconductor chips 210 have the same orientation, but the semiconductor chips are not yet arranged in direct contact with the carrier 10. For example, the semiconductor chips 210 have a greater density than the medium 220 surrounding the semiconductor chips so that after a given time the semiconductor chips sink in the medium 220 and are in direct contact with the carrier 10. Additionally, the attractive Coulomb forces of the first electrode 601 and the carrier 10 on the positive carriers may pull the semiconductor chips 210 toward the carrier.

Figure 1C:
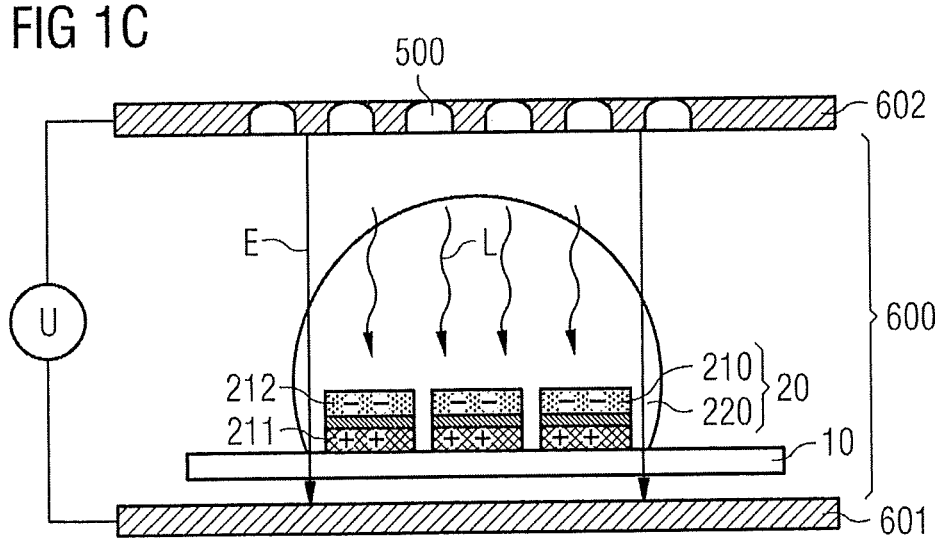

FIG. 1C is a schematic sectional view of an alternative example of the device that produces a semiconductor component 1 and the method of aligning semiconductor chips 210 in a medium 220 and the method of arranging semiconductor chips 210 on a carrier 10. In contrast to the method shown in FIG. 1B, the light source 500 is integrated into the second electrode 602. In particular, the device that produces a semiconductor component 1 comprises a multiplicity of light sources 500. The light sources 500 may, for example, be light-emitting diodes arranged in cut-outs of the second electrode 602. For example, the cut-outs may be arranged in the side (602a) of the second electrode facing the first electrode (601). In particular, the cut-outs can completely penetrate the second electrode transversely to its main extension plane. Alternatively, the light sources 500 may be light guides, by which the electromagnetic radiation L is incorporated in the region 600 between the first electrode 601 and the second electrode 602. Further, the example of FIGS. 1B and 1C differ in the arrangement of the electrode 601. In the example of FIG. 1C, the first electrode 601 is not in direct contact with the carrier 10. Advantageously, in this arrangement, an electrostatic charging of the carrier and the suspension 20 avoided.

In the example shown here, the semiconductor chips 210 are in direct mechanical contact with the carrier 10. The semiconductor chips 210 have, for example, a greater density than the surrounding medium 220 so that the semiconductor chips 210 sink after alignment on the carrier 10 and are in direct mechanical contact with the carrier 10. Additionally or alternatively, the semiconductor chips may be attracted to the carrier by the Coulomb forces acting on the free charge carriers in the p-conducting and n-conducting regions of the semiconductor chips 210 and are in direct mechanical contact with the carrier 10.

FIG. 1D shows a schematic sectional view of an alternative example of the device that produces a semiconductor component 1 and the method of aligning semiconductor chips 210 in a medium 220 and the method of arranging semiconductor chips 210 on a carrier 10. In contrast to example shown in FIG. 1B, the first electrode 601 is formed by the carrier 10. The carrier 10 directly electrically connects to the voltage source U. By the voltage source U, an electric field E is generated between the first electrode 601 or the carrier 10 and the second electrode 602. The second electrode is arranged on the side of the carrier 10 facing the semiconductor chips. Analogous to the example shown in FIG. 1B, a light source 500 is arranged between the first electrode 601 and the second electrode 602. The light source 500 emits electromagnetic radiation L absorbed by the semiconductor chips 210 so that free charge carriers are generated in the semiconductor chips.

The semiconductor chips are oriented along the electric field E and have sunk to the surface of the carrier 10. FIG. 1E shows a method step subsequent to FIG. 1D, in which the medium 220 has been completely removed. For example, the medium 220 was completely removed by evaporation. For this purpose, for example, the carrier 10 and the semiconductor chips 210 were heated so that the medium 220 has evaporated. Alternatively, the medium was rinsed from the carrier by liquid, after which residues of the liquid were removed by evaporation. In particular, the medium 220 or the liquid has been removed while the semiconductor chips 210 are arranged in the electric field E and while the semiconductor chips 210 are exposed to electromagnetic radiation L.

Figure 2:
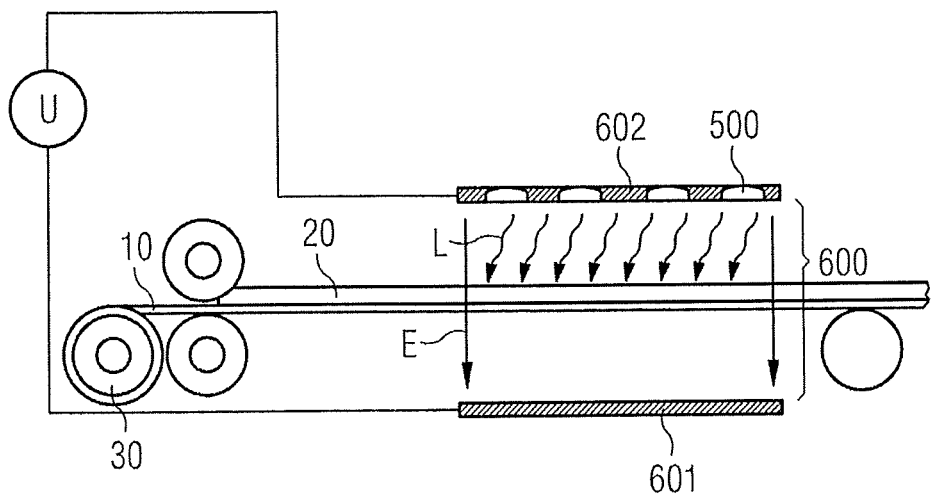
FIG. 2 shows a method of arranging semiconductor chips on a carrier.

FIG. 2 shows a device that produces a semiconductor component 1 with which, for example, the method of arranging semiconductor chips 210 on a carrier 10 can be carried out. The device comprises a first electrode 601 and a second electrode 602 electrically conductively connected to a voltage source U. By the first electrode 601 and the second electrode 601, an electric field E is generated between the electrodes. In the second electrode 602, a plurality of light sources 500 are integrated. The light sources 500 emit electromagnetic radiation L that passes through the region 600 between the first electrode 601 and the second electrode 602. A carrier 10 is arranged in region 600. On the side of the carrier facing the light sources 500 a suspension 20 is arranged. The suspension 20 comprises a liquid, electrically insulating medium 220 and semiconductor chips 210. In particular, the carrier 10 is designed to be rollable on a roll 30.

In the device shown in FIG. 2, the carrier 10 is unrolled from the roller 30 and transported by further rollers 30 into the region 600 between the first electrode 601 and the second electrode 602. The suspension 20 is placed on the carrier 10 before the carrier 10 passes through the region 600. For example, the suspension 20 is arranged on the carrier 10 by printing. In particular, the suspension 20 is arranged on the carrier 10 by ink jet printing or a pressure roller.

Free charge carrier pairs are generated in the semiconductor chips in region 600 between the first electrode 601 and the second electrode 602. The charge carriers migrate into the p-conducting 211 and n-conducting 212 regions due to the photovoltaic effect. Thus, the semiconductor chips 210 in the suspension 20 can be aligned by the Coulomb forces arising in the electric field E. After the semiconductor chips 210 have been aligned, the carrier 10 and the suspension 20 are transported via further rollers so that, for example, the medium 220 can be removed or cured and subsequently further method steps for electrical contacting and singulation of the semiconductor components 1 can be performed.

Figure 3A:
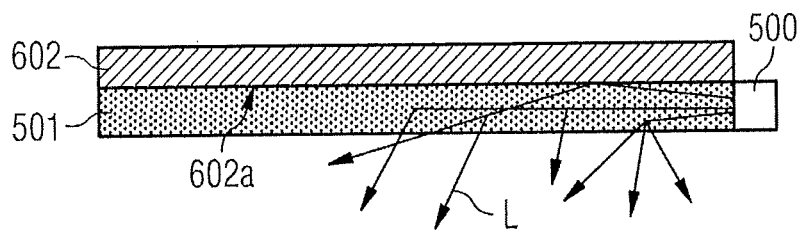
FIGS. 3A and 3B show examples of an electrode of a device that produces a semiconductor component.

FIG. 3A shows a schematic sectional view of a part of a device that produces a semiconductor component 1. This sectional view shows a special example of the second electrode 602, on whose surface 602a a light guide 501 is arranged. The surface 602a is the surface of the second electrode 602 facing the first electrode 601. Furthermore, the device comprises a light source 500 arranged on a side surface of the light guide 501. A side surface is the surface extending transversely to the main extension plane of the light guide 501. Electromagnetic radiation L coupled through the side surface of the light guide 501 is scattered in the light guide 501 so that the electromagnetic radiation L emerges from the light guide 501. The electromagnetic radiation L exits through the side of the light guide 501 facing away from the second electrode 602. Advantageously, this example of the second electrode 602 and the light source 500 and the light guide 501 enables a particularly close arrangement of the electrode 602 on the electrode 601, which is arranged on the side of the second electrode 602 facing the light guide. This leads to a particularly strong electric field between the electrodes so that the semiconductor chips can be aligned particularly reliably. In addition, the second electrode 602 has no cut-outs so that a particularly homogeneous electric field E can be generated by this device.

Figure 3B:
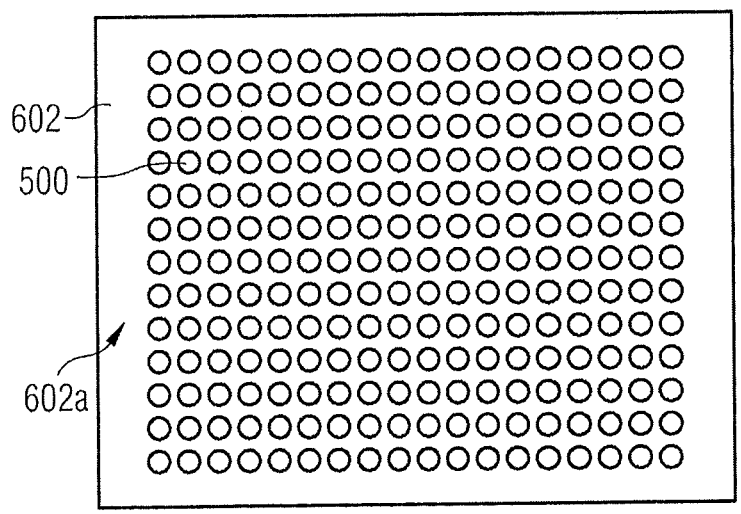

FIG. 3B shows an alternative example of a part of the device that produces a semiconductor component 1 compared to FIG. 3A. In particular, a design of the second electrode 602 is shown in which a multiplicity of light sources 500 are arranged on the surface 602a. For example, the light sources are light-emitting diodes arranged in cut-outs of the second electrode 602. Alternatively, the light sources 500 may be the ends of a plurality of optical fibers 501, by which electromagnetic radiation L is coupled into the region between the first electrode 601 and the second electrode 602. Advantageously, this example of the device allows a particularly high intensity of the electromagnetic radiation L with which the semiconductor chips are exposed.

Figure 4A:
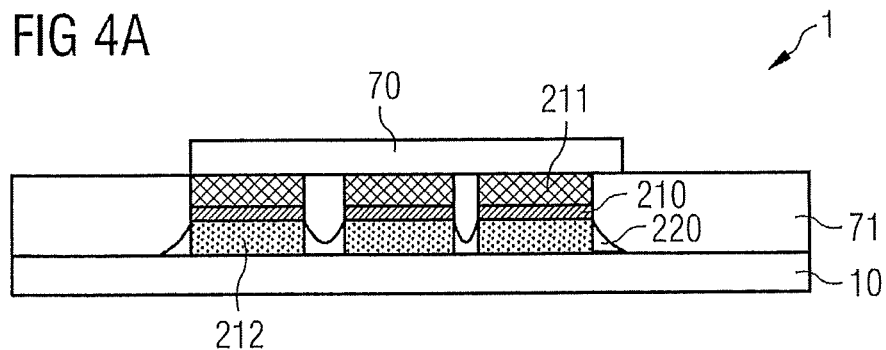
FIGS. 4A, 4B, and 4C show examples of our semiconductor component.

FIG. 4A shows a schematic sectional view of a semiconductor component 1 described here according to a first example. The semiconductor component 1 comprises a carrier 10 on the surface of which a multiplicity of semiconductor chips 210 are arranged. The semiconductor chips are in direct contact with the carrier 10 via the n-conducting region 212. Residues of the medium 220 are arranged in regions of the surface of the carrier 10 and on side surfaces of the semiconductor chips 210. In these regions, the medium 220 may serve as a connection material between the semiconductor chips 210 and the carrier 10. Thus, the semiconductor chips are mechanically fixedly connected to the carrier 10 via the connecting material formed by the medium 220. Regions between the semiconductor chips 210 are filled with an insulating layer 71. In particular, the insulating layer 71 completely covers the side surfaces of the semiconductor chips that connect the surface 210a facing away from the carrier 10 and the lower surface of the semiconductor chips 210 facing the carrier 10. On the side of the semiconductor chips 210 facing away from the carrier, no medium 220 and no insulating layer 71 are arranged. The side facing away from the carrier 10 of the semiconductor chips 210 is thus free of the insulating layer 71 and the medium 220.

On the side facing away from the carrier 10 of the semiconductor chips 210, an electrical contact 70 is arranged. The semiconductor chips 210 can be electrically contacted and operated via the carrier 10 and the electrical contact 70. In particular, the electrical contact can be made transparent or reflective for the electromagnetic radiation generated in the semiconductor chips 210. Furthermore, the carrier 10 can be made transparent or reflective for the electromagnetic radiation generated in the semiconductor chips 210.

Figure 4B:
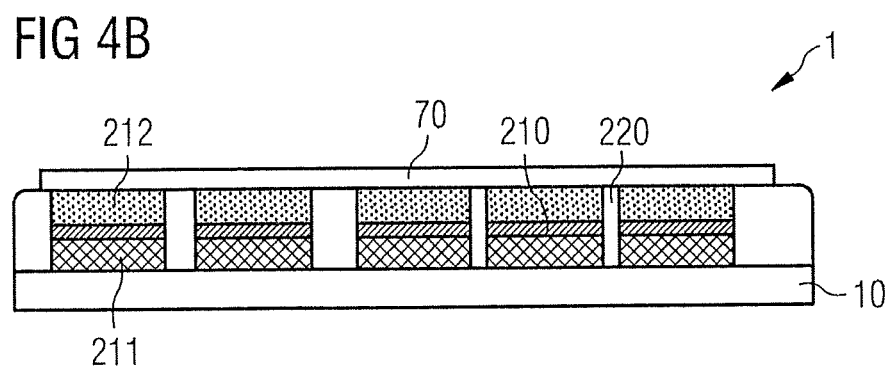

FIG. 4B shows a schematic sectional view of a semiconductor component 1 according to a second example. In contrast to the first example, the medium here completely covers the side surfaces of the semiconductor chips 210 and the semiconductor chips are in direct contact with the carrier 10 via the p-conductive region 211. For example, the medium 220 serves as a mechanical connection material between the semiconductor chips 210 and the carrier 10. Further, the medium 220 is formed of an electrically insulating material. The surfaces of the semiconductor chips 210 facing away from the carrier 10 are free of the medium 220. For example, the side of the medium 220 facing away from the carrier 10 terminates flush with the sides of the semiconductor chips facing away from the carrier. For example, after aligning the semiconductor chips and after curing the medium 220, the medium 220 has been partially removed. In particular, the medium was removed by polishing the surface of the semiconductor chips 210 facing away from the carrier.

The electrical contact 70 and the carrier 10 and the medium 220 may each be designed to be reflective or transparent to the electromagnetic radiation generated in the semiconductor chips. Alternatively, the carrier 10, the electrical contact 70 or the medium 220 may comprise a conversion material designed to convert electromagnetic radiation emitted by the semiconductor chips 210 into electromagnetic radiation of a longer wavelength range.

Figure 4C:
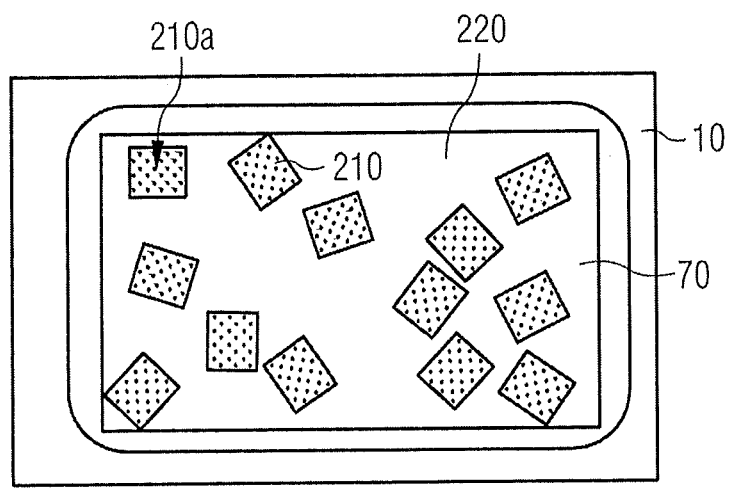

FIG. 4C shows a plan view of a semiconductor component 1 according to the second example. In this example, the electrical contacting 70 is made transparent so that the side 210a of the semiconductor chips 210 facing away from the carrier is visible. In the lateral plane, the semiconductor chips are completely surrounded by the medium 220. The semiconductor chips 210 are arranged on the carrier by a printing process. In particular, the semiconductor chips are arranged at irregular distances from one another on the carrier 10. Furthermore, the semiconductor chips can be arranged and rotated relative to one another. In this context, rotated relative to one another means that the semiconductor chips are rotated about an axis of symmetry perpendicular to the surface 210a of the semiconductor chips 210 facing away from the carrier 10.

Our methods, devices and components are not restricted to the examples by the description on the basis of the examples. Rather, this disclosure encompasses any new feature and also any combination of features that in particular comprises any combination of features in the appended claims and any combination of features in the examples, even if the feature or combination itself is not explicitly specified in the claims or examples.

This application claims priority of DE 102016116353.8, the subject matter of which is incorporated herein by reference.

The invention claimed is:

1. A method of aligning semiconductor chips in a medium comprising:
    providing an electrically insulating liquid medium;
    providing semiconductor chips;
    forming a suspension with the medium and the semiconductor chips;
    exposing the semiconductor chips to electromagnetic radiation that generates free charge carriers in the semiconductor chips;
    arranging the suspension in an electric field in which the semiconductor chips are aligned along the electric field; and
    curing the medium after aligning the semiconductor chips.

2. The method according to claim 1, wherein the medium is transparent for the electromagnetic radiation used to generate the free charge carriers.

3. The method according to claim 1, wherein the exposure of the semiconductor chips to electromagnetic radiation and arrangement of the suspension in an electric field takes place simultaneously.

4. The method chips according to claim 1, wherein the electric field is formed between a first and a second electrode, and a distance of the suspension to the first electrode is smaller than a distance to the second electrode.

5. The method according to claim 1, wherein the semiconductor chips comprise a region with a band gap, and the electromagnetic radiation has an energy greater than the energy of the band gap.

6. A method of arranging semiconductor chips on a carrier comprising performing the method according to claim 1, wherein the suspension is arranged on the carrier.

7. The method according to claim 6, wherein the suspension is arranged on the carrier by a printing process.

8. The method according to claim 6, wherein the first electrode is in direct contact with the carrier.

9. The method according to claim 6, wherein, after aligning the semiconductor chips, the medium is cured.

10. The method according to claim 9, wherein, after curing the medium, a side of the semiconductor chips facing away from the carrier is free of the medium or is exposed in selected locations.

11. The method according to claim 7, wherein, after aligning the semiconductor chips, the medium is completely removed.

12. The method according to claim 9, wherein, after curing or removal of the medium, at least 70% of the semiconductor chips are in direct contact with the carrier.

13. The method according to claim 6, wherein the carrier is adapted to be used in a roll-to-roll process.

14. The method according to claim 6, wherein the carrier is the first electrode by which the electric field is generated.

15. A device that produces a semiconductor component having a light source, a first electrode, and a second electrode, comprising:
    means for adapting the light source to illuminate a region between the first and the second electrode with electromagnetic radiation,
    means for adapting the first and the second electrode to generate in the region an electric field,
    means for providing a suspension comprising a medium and semiconductor chips that arranges an electric field between the electrodes, and means for arranging a light source such that the second electrode has a surface with at least one cut-out, or the second electrode has a surface on which a light guide is arranged.

16. The device according to claim 15, wherein the second electrode has a surface with at least one cut-out, and in the cut-out a light source is arranged.

17. The device according to claim 15, wherein the second electrode has a surface on which a light guide is arranged.

18. A semiconductor component comprising a carrier and a plurality of semiconductor chips, wherein
the semiconductor chips each have a n-conducting region and a p-conducting region,
at least 70% of the semiconductor chips have the same orientation and are in direct contact with the carrier,
the semiconductor chips have a maximum edge length of 10 μm,
the semiconductor chips are arranged on the carrier by printing, and
the semiconductor chips are surrounded in the lateral plane by a cured medium.

19. The semiconductor component according claim 18, wherein
the semiconductor chips are electrically conductively contacted and operated via the carrier and an electrical contact, and
the electrical contact is arranged on the side of the semiconductor chip facing away from the carrier.

\* \* \* \* \*